(12) United States Patent
Wang et al.

(10) Patent No.: US 11,984,463 B2
(45) Date of Patent: May 14, 2024

(54) FLARE-REDUCING IMAGE SENSOR

(71) Applicant: OmniVision Technologies, Inc., Santa Clara, CA (US)

(72) Inventors: Qin Wang, San Jose, CA (US); Chao Niu, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 394 days.

(21) Appl. No.: 17/464,192

(22) Filed: Sep. 1, 2021

(65) Prior Publication Data

US 2023/0061285 A1   Mar. 2, 2023

(51) Int. Cl.
*H01L 27/146* (2006.01)
*G02B 1/10* (2015.01)
*G02B 3/00* (2006.01)
*G02B 5/30* (2006.01)

(52) U.S. Cl.
CPC ............ *H01L 27/1462* (2013.01); *G02B 1/10* (2013.01); *G02B 3/0037* (2013.01); *G02B 5/3083* (2013.01); *H01L 27/14627* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 2022/0102412 A1* | 3/2022 | Chang | H01L 27/14627 |
| 2022/0137267 A1* | 5/2022 | Park | G02B 3/0006 |
| | | | 348/302 |
| 2022/0137424 A1* | 5/2022 | Lee | H01L 27/1462 |
| | | | 257/432 |
| 2022/0141427 A1* | 5/2022 | Roh | H04N 25/135 |
| | | | 348/164 |
| 2023/0044798 A1* | 2/2023 | Ahn | H01L 27/14621 |
| 2023/0238409 A1* | 7/2023 | Roh | G02B 3/0087 |
| | | | 257/432 |

\* cited by examiner

*Primary Examiner* — Nduka E Ojeh
(74) *Attorney, Agent, or Firm* — COZEN O'CONNOR

(57) ABSTRACT

A flare-reducing image sensor includes a plurality of pixels, $N_P$ in number, and a plurality of microlenses, $N_{ML}$ in number, where each of the plurality of microlenses is aligned to a respective one of the plurality of pixels, such that $N_P = N_{ML}$. The flare-reducing image sensor further includes a plurality of phase-shifting layers, $N_L$, in number, where each phase-shifting layer is aligned with a respective one of the plurality of microlenses, where $N_L$, is less than or equal to $N_{ML}$.

18 Claims, 3 Drawing Sheets

FLARE-REDUCING IMAGE SENSOR

BACKGROUND

Camera modules in commercial products such as stand-alone digital cameras, mobile devices, automotive components, and medical devices include an image sensor having a pixel array. The pixel array includes a plurality of pixels arranged as a two-dimensional periodic array. Many image sensors include a microlens array, formed of a plurality of microlenses each aligned to a respective pixel. The periodicity of the image sensor's pixel array and microlens array thereon result in the image sensor resembling a reflective two-dimensional diffraction grating. Part of light incident on the image sensor is diffracted toward the camera's imaging lens. Different elements of the camera, e.g., a cover glass, an IR-cut filter, a surface of the imaging lens, reflect this diffracted light back toward the image sensor, which produces an image artifact known as petal flare.

SUMMARY OF THE EMBODIMENTS

Embodiments disclosed herein reduce petal flare. In a first aspect, a flare-reducing image sensor includes a plurality of pixels, $N_P$ in number, and a plurality of microlenses, $N_{ML}$ in number, where each of the plurality of microlenses is aligned to a respective one of the plurality of pixels, such that $N_P = N_{ML}$. The flare-reducing image sensor further includes a plurality of phase-shifting layers, $N_L$, in number, where each phase-shifting layer is aligned with a respective one of the plurality of microlenses, where $N_L$, is less than or equal to $N_{ML}$.

DETAILED DESCRIPTION OF THE EMBODIMENTS

Petal flare occurs when light scatters from one lens within an image sensor onto another, distorting an image. For example, when light reflects, diffracts, or is incident upon a lens, the light may interfere with nearby lenses. One aspect of the present embodiments includes the realization that a primary source of petal flare is light incident on, and focused, by a lens or microlens of an adjacent pixel. Embodiments of the present disclosure reduce petal flare by adding a phase-shifting layer to microlenses.

A microlens may be a lens with a width ranging between ten micrometers and a millimeter. A phase-shifting layer may be a chemical vapor deposition (CVD) oxide layer on a microlens with a thickness equivalent to a quarter-wave of red wavelength.

Figure 1:
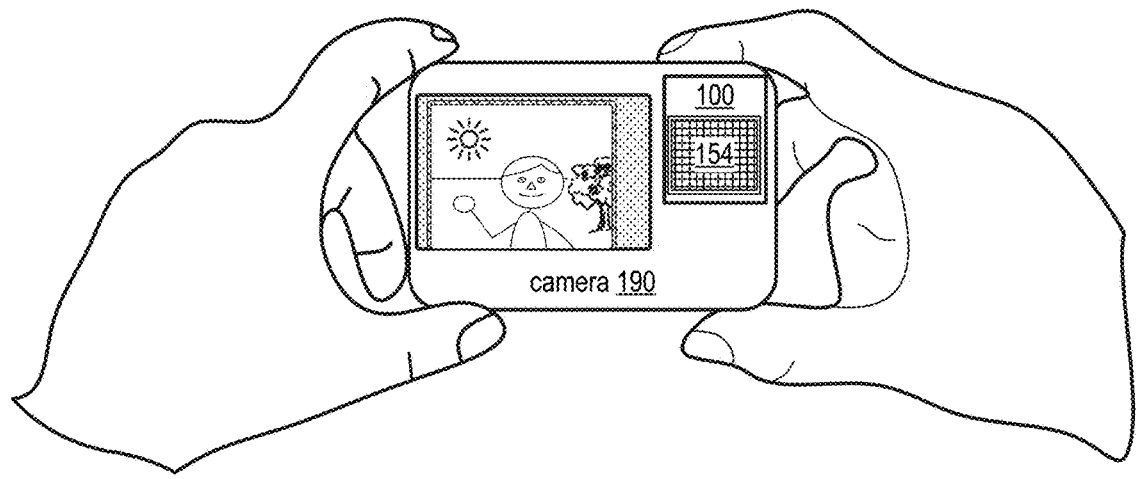
FIG. 1 depicts a camera imaging a scene, according to an embodiment.

FIG. 1 shows an image sensor 100, which includes a pixel array 154. In the scenario depicted in FIG. 1, image sensor 100 is incorporated in a camera 190 imaging a scene. Camera 190 includes an image sensor 100, which includes a pixel array 154. Image sensor 100 may be part of a chip-scale package or a chip-on-board package.

Figure 2:
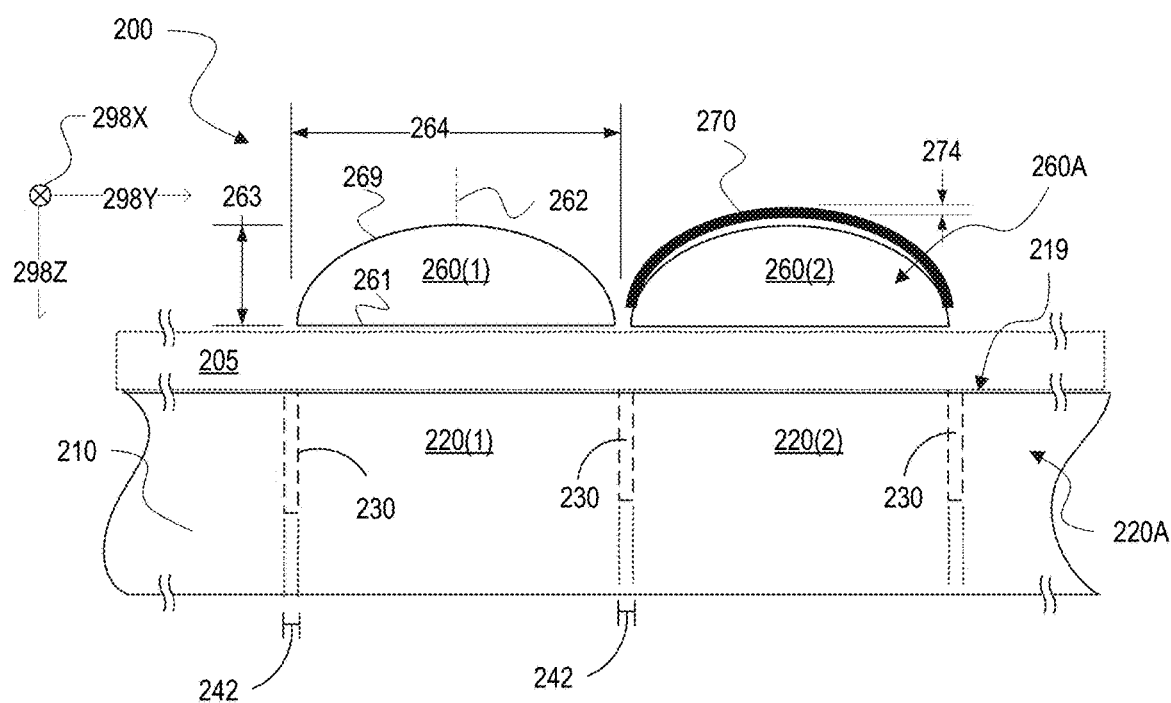
FIG. 2 is a schematic of a pixel array of a flare-reducing image sensor, which is an embodiment of the image sensor of FIG. 1.

FIG. 2 is a cross-sectional schematic of a flare-reducing image sensor 200, which is an example of image sensor 100. The cross-section illustrated in FIG. 2 is orthogonal to a plane, hereinafter the x-y plane, formed by orthogonal directions 298X and 298Y, which are each orthogonal to direction 298Z. Cross-sectional plane depicted in FIG. 2 is parallel to the y-z plane. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto.

Flare-reducing image sensor 200 includes a semiconductor substrate 210, a plurality of pixels 220 formed therein, a plurality of microlenses 260, and a plurality of phase-shifting layers 270. A technical benefit of phase-shifting layer 270 is to prevent the aforementioned petal flare within image sensor 200. The plurality of pixels 220 form a pixel array 220A, and the plurality of microlenses 260 form a microlens array 260A.

In embodiments, flare-reducing image sensor 200 includes an intermediate layer 205 between the microlens 260 and semiconductor substrate 210. Intermediate layer 205 may include at least one of a spectral filter and a buffer oxide layer.

Semiconductor substrate 210 has a top substrate surface 219, which may be perpendicular to direction 298Z. The plurality of pixels 220 form a pixel array 220A that has a pixel pitch $P_x$ and $P_y$ in respective orthogonal directions x and y and consists of $N_P$ pixels, where $N_P$ is a positive integer. The plurality of pixels 220 include pixels 220(1) through 220($N_P$).

Microlens 260 has an optical axis 262, which may be perpendicular to top substrate surface 219. Microlens 260 has an upper surface 269 and a lower surface 261. Lower surface 261 of microlens 260 may be flat in the plane parallel to x-y plane. Upper surface 269 of microlens 260 is a convex curvature with a radius of $R_m$ around the optical axis 262. Flare-reducing image sensor 200 may include a plurality of microlenses 260 that form a microlens array 260A. In embodiments, microlens array 260A has $N_P$ microlenses 260; each microlens 260 is aligned with a respective pixel 220.

Each phase-shift layer 270 is aligned with a respective microlens 260 and forms a phase-shift layer array. The phase-shift layer array consists of $N_L$ phase-shift layers 270, where $N_L$ is equal or less than $N_P$. In embodiments, phase-shift layer 270 has the same size and curvature as upper surface 269 of microlens 260. Phase-shift layer has a thickness 274, which may be between 100 and 200 nanometers. In embodiments, phase-shift layer 270 is a conformal coating on upper surface 269.

In embodiments, an optical thickness of phase-shift layer 270 is equal to a quarter-wave at a wavelength between 600 nm and 750 nm, where the optical thickness at a free-space wavelength $\lambda_0$ is the product of the geometric thickness of phase-shift layer 270 by the refractive index of phase-shift layer 270 at free-space wavelength A. For example, the free-space wavelength $\lambda_0$ may be 630 nm. In embodiments, the quarter-wave optical thickness applies to one of a red, blue, and green wavelength, or 600 nm-750 nm, 400 nm-525 nm, and 475 nm-560 nm, respectively.

Phase-shift layer 270 may be a CVD oxide layer fabricated as a part of microlens 260 or deposited on top of microlens 260. Photoresist layer may be utilized to protect phase-shift layer 270 while etching to form microlens 260.

Figure 3:
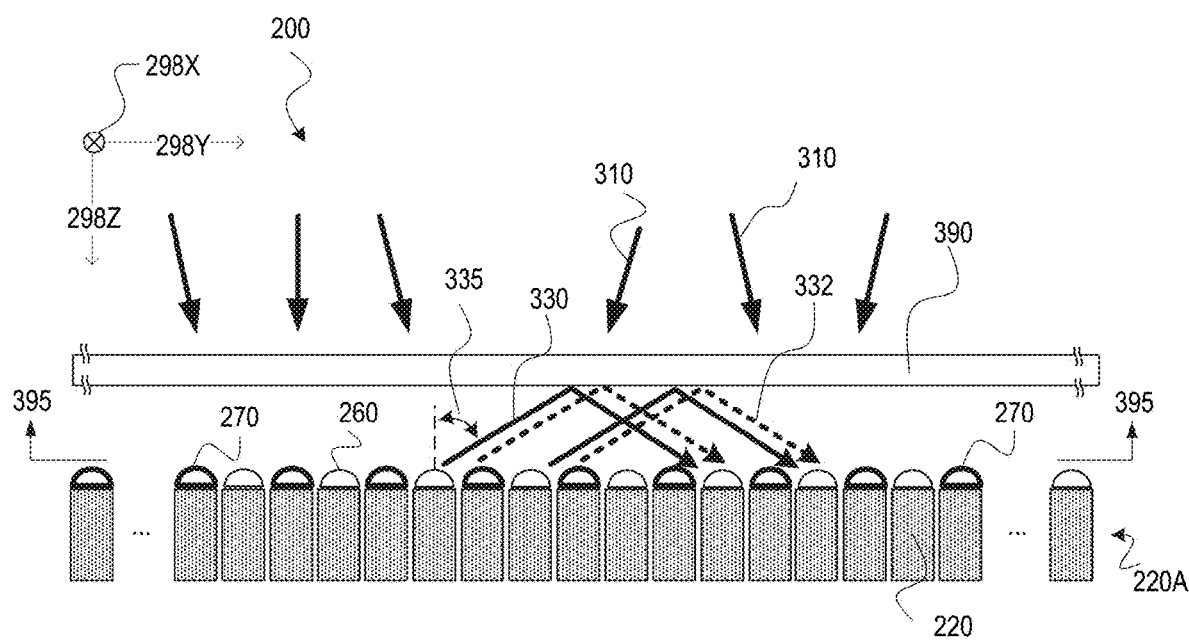
FIG. 3 shows a pixel array with phase-shifting layers aligned with a set of microlenses, according to an embodiment.

FIG. 3 is an expanded view of flare-reducing image sensor 200. The cross-section illustrated in FIG. 3 is orthogonal to x-y plane and is on the same plane as the cross-sectional plane of FIG. 2.

Figure 4:
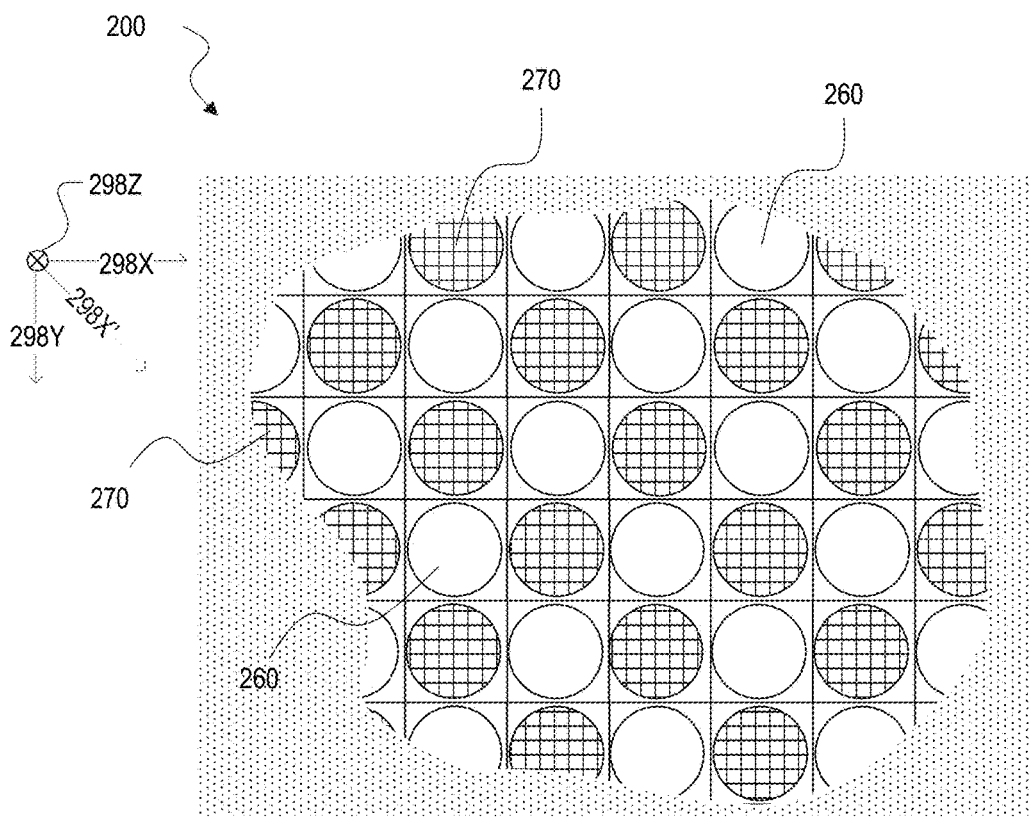
FIG. 4 is an illustration of an arrangement of a phase-shift layer array, according to an embodiment.

FIG. 3 indicates a cross-sectional plane 395, which is the cross-sectional plane of FIG. 4 and is parallel to the x-y plane. FIG. 4 is a plan view of flare-reducing image sensor 200 viewed from plane 395. FIG. 4 denotes a direction 298X' that is orthogonal to 298Z and is in the plane formed by 298X and 298Y. The direction 298X' is 45° from both 298X and 298Y directions in the x-y plane. FIGS. 3 and 4 are best viewed together in the following description.

Flare-reducing image sensor 200 in FIG. 3 includes a filter layer 390, a plurality of pixels 220, a plurality of microlenses 260, and a plurality of phase-shift layers 270. Filter layer 390 may be an infrared cutoff filter.

In the example illustrated in FIG. 3, flare-reducing image sensor 200 has phase-shift layer 270 on microlenses 260 whose adjacent microlenses do not have accompanying phase-shift layer, such that a total number of phase-shift layer 270, $N_L$, is half of a total number of microlenses 260, $N_{ML}$, or $N_L = \frac{1}{2} N_{ML}$.

Pixel array 220A has a pixel pitch $P_x$ and $P_y$ in respective directions x and y. In embodiments, pixel pitch may be between 0.5 μm and 3 μm in x and y directions. Each phase-shift layer 270 may be separated from an adjacent phase-shift layer by distances $D_x$ and $D_y$ in respective directions x and y. In embodiments, $D_x$ is greater than $P_x$, and $D_y$ is greater than $P_y$. In the example shown in FIGS. 3 and 4, $P_x$ and $P_y$ are equal, or a in length, and phase-shift layers 270 have a periodicity in the direction of 298X' with a phase-shift layer pitch of b, where $b = a\sqrt{2}$.

In the example of flare-reducing image sensor 200, microlens array 260A has the same pitch as the pixel array 220A. In embodiments, microlens array 260A, with a pitch 264, acts as a diffraction grating for reflected light 330 with $d \sin \theta_m = m_i \lambda$, where d denotes pitch 264 of microlens array 260A, $\theta_m$ is reflected light angle 335, $m_i$ is an order of intensity maxima, and $\lambda$ is wavelength of the incident light. Among the intensity maxima of reflected light 330, second-order, or $m_i = 2$, results in an image flare when reflected light 330 is absorbed or detected in image sensor 200. Destructive interference for the second-order intensity maximum may be created by phase-shifted reflected light 332, after having its phase shifted by half-wave by phase-shift layer 270, and the result is a reduced image flare. In embodiments, the reflected light angle for a second-order intensity maximum is between 30° and 40°.

Figure 5:
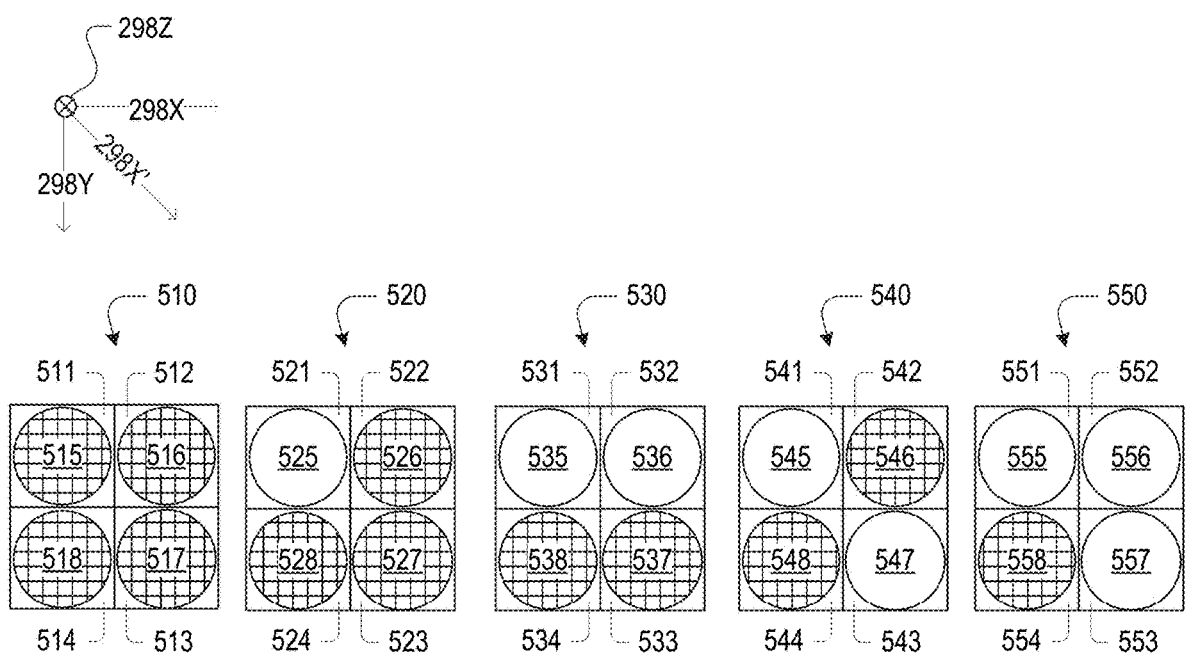
FIG. 5 shows five examples of pixel sub-arrays each with a different arrangement of phase-shifting layers.

Periodicity of phase-shift layers 270 shown in the example of FIG. 4 may be represented by a repeating pattern of a N×N array of pixels or microlenses, where N is a positive number in x and y directions. For example, N may be 2, and the possible patterns of 2×2 array are shown in FIG. 5 as pixel sub-arrays 510, 520, 530, 540, and 550. In FIG. 5, hatched circles, such as 515 and 526, represent the locations of phase-shift layers, and open circles, such as 525 and 536, represent the locations of microlenses without the accompanying phase-shift layers. Each square in FIG. 5, such as 511 or 522, illustrates a pixel aligned with the respective microlens, such as 515 or 526.

Each pixel sub-array in FIG. 5 results in the same configuration of the phase-shift layers when the 2×2 array pattern is repeated (e.g., tiled) under any multiple rotations of 90° in x-y plane about the z direction. For example, pixel sub-array 550 includes one microlens 558 aligned with a phase-shift layer. When the 2×2 array pattern is tiled, the pitch of the phase-shift layers is twice the pitch of the pixel array or the microlens array, and the total number of phase-shift layers is quarter of the total number of pixels. The pitch and the total number of phase-shift layers aligned with respective microlenses do not change under a rotation of the 2×2 array pattern about the 298Z direction.

In pixel sub-array 510, each pixel (511, 512, 513, and 514) aligned with a respective microlens (515, 516, 517, and 518) includes a phase-shift layer aligned with the respective microlens. In effect, with a tiled pattern of 2×2 array of pixel sub-array 510, a phase-shift layer is aligned with every microlens, and therefore every pixel, of the image sensor. In this pixel sub-array 510, the number of phase-shift layers is equal to each of the numbers of pixels and microlenses in the pixel array, $N_L = N_{ML} = N_P$, and the pixel pitch is the same as the pitch of phase-shift layers: $P_x = D_x$ and $P_y = D_y$.

In pixel sub-array 520, three of the microlenses (526, 527, and 528) of the four shown in the 2×2 array have phase-shift layers aligned with the microlenses. With a tiled pattern of 2×2 array of pixel sub-array 520, the number of microlenses with the aligned phase-shift layers is three quarters of the total number of microlenses, such that $N_L = \frac{3}{4} N_{ML} = \frac{3}{4} N_P$. In embodiments, a distance between any two closest microlenses without accompanying phase-shift layers is $mP_x$, where m is an integer greater than one.

In pixel sub-array 530, both microlenses 537 and 538 in the second row, parallel to 298X direction, have phase-shift layers aligned. With this tiled pattern of 2×2 array, each row, parallel to 298X direction or each column, parallel to 298Y direction, has all microlenses aligned with phase-shift layers while its adjacent row or column has all microlenses without phase-shift layers. The total number of phase-shift layers is half the total number of pixels, such that $N_L = \frac{1}{2} N_{ML} = \frac{1}{2} N_P$. In embodiments, alternating rows of microlenses in either direction x or y are accompanied with phase-shift layers.

Pixel sub-array 540 is equivalent to the example shown in FIGS. 3 and 4, where the total number of phase-shift layers is half of the number of pixels in the pixel array: $N_L = \frac{1}{2} N_{ML} = \frac{1}{2} N_P$. The phase-shift layer array has a pitch of $b = \sqrt{P_x^2 + P_y^2}$ or $b = a\sqrt{2}$ if $P_x = P_y = a$ in 298X' direction. In embodiments, the pitch of the phase-shift layer array may be integer multiples of the base pitch: $b = na\sqrt{2}$, where n is a positive integer.

In pixel sub-array 550, one microlens 558 of the four microlenses shown in the 2×2 array has a phase-shift layer aligned with the microlens. The total number of microlenses with the aligned phase-shift layers is a quarter of the total number of microlenses, such that $N_L = \frac{1}{4} N_{ML} = \frac{1}{4} N_P$. When the pattern of 2×2 array is tiled, the phase-shift layer array has a pitch equal to twice the pitch the pixel array: or $D_x = D_y = 2P_x = 2P_y = 2a$. In embodiments, the pitch of the phase-shift layer array may be integer multiples of the base pitch: $b = na$, where n is a positive integer.

Figure 6:
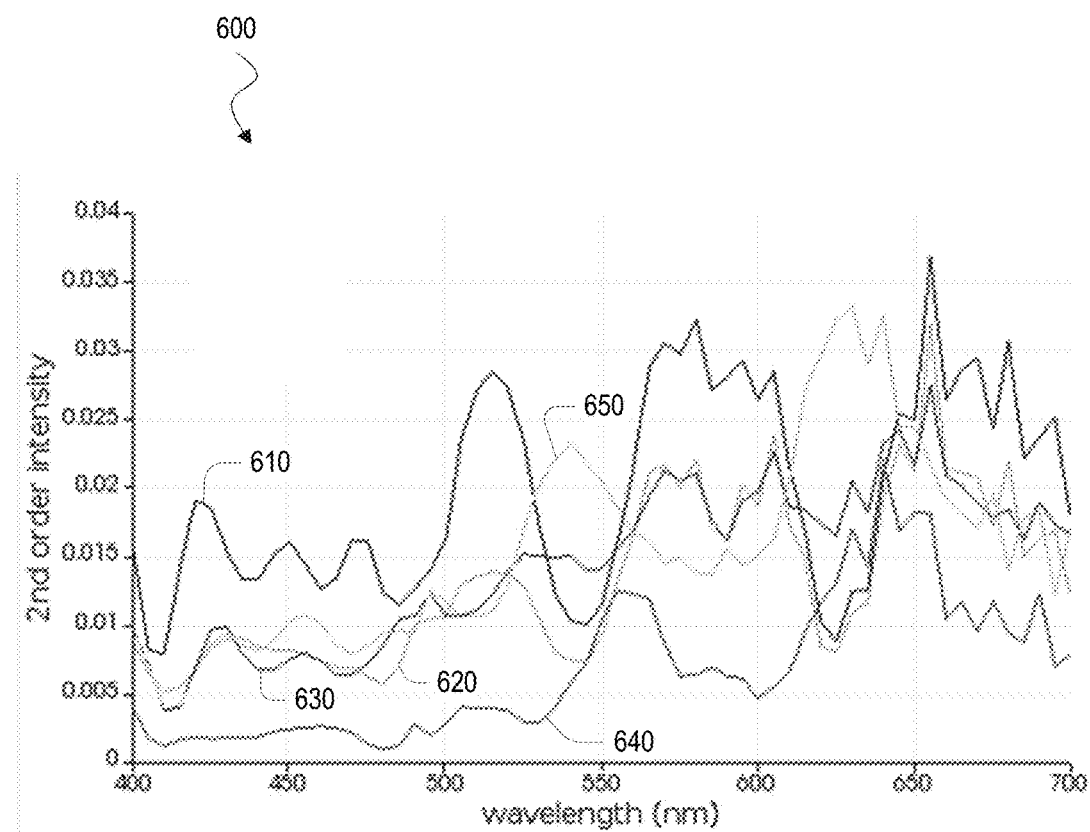
FIG. 6 is a graph showing measurements of second-order diffraction intensity for the five examples of pixel sub-arrays shown in FIG. 5.

FIG. 6 shows a graph 600 of second order diffraction intensity of light at wavelengths ranging from 400 nm to 700 nm. Graph 600 includes diffraction measurements 610, 620, 630, 640, and 650, corresponding to pixel sub-arrays 510, 520, 530, 540, and 550 of FIG. 5, respectively. Diffraction measurements indicate pixel sub-arrays 520-550 perform better in reducing the second order diffraction intensity in the lower wavelengths compared to pixel sub-array 510. Of pixel sub-arrays 510-550, pixel sub-array 540 shows the best performance in reducing the second order diffraction intensity over a large range of the wavelengths.

Combinations of Features

Features described above as well as those claimed below may be combined in various ways without departing from the scope hereof. The following enumerated examples illustrate some possible, non-limiting combinations.

(A1) A flare-reducing image sensor includes a plurality of pixels, $N_P$ in number, in a semiconductor substrate and forming a pixel array and a plurality of microlenses, $N_{ML}$ in number, each aligned with a respective on of plurality of pixels and forming a microlens array, $N_{ML}$ being equal to $N_P$. The flare-reducing image sensor further includes a plurality of phase-shift layers, $N_L$ in number, each aligned with a respective microlens of the microlens array, $N_L$ being less than or equal to $N_P$.

(A2) In embodiments of image sensor (A1), the pixel array has a pixel pitch $P_x$ and $P_y$ in respective orthogonal directions x and y each parallel to a top surface of the semiconductor substrate. An average spacing between each phase-shift layer is A and $D_y$, in directions x and y respectively, at least one of (i) $D_x$ exceeds $P_x$ and (ii) $D_y$ exceeds $P_y$.

(A3) In embodiments of image sensor (A1), each microlens has an upper surface and, between the upper surface and the semiconductor substrate, a lower surface. For each phase-shift layer of the plurality of phase-shift layers and the respective microlens of the plurality of microlenses aligned thereto, the phase-shift layer is on the upper surface of the microlens.

(A4) In embodiments of image sensor (A1), the phase-shift layer is formed of an oxide.

(A5) In embodiments of image sensor (A1), an optical thickness of the phase-shift layer is a quarter-wave at a wavelength between 620 nm and 750 nm.

(A6) In embodiments of image sensor (A5), the wavelength is 630 nm.

(A7) In embodiments of any of image sensors (A2)-(A6), the average spacing, A and $D_y$, is greater in both directions x and y than the pixel pitch, such that $D_x$ exceeds $P_x$, and $D_y$ exceeds $P_y$.

(A8) In embodiments of image sensor (A7), the phase-shift layer is diagonally adjacent with the average spacing of $\sqrt{P_x^2+P_y^2}$.

(A9) In embodiments of any of image sensors (A2)-(A7), the average spacing between any two closest phase-shift layers is $n\sqrt{P_x^2+P_y^2}$, where n is a positive integer.

(A10) In embodiments of any of image sensors (A2)-(A7), a distance between any two closest microlenses without accompanying phase-shift layers is $n\sqrt{P_x^2+P_y^2}$, where n is a positive integer.

(A11) In embodiments of any of image sensors (A2)-(A7), alternating rows of microlenses in either direction x or y are accompanied with phase-shift layers.

(A12) In embodiments of any of image sensors (A2)-(A7), the pixel pitch in orthogonal directions x and y is equal, such that $P_x=P_y$.

(A13) In embodiments of image sensor (A12), the average spacing between each phase-shift layer in orthogonal directions x and y is equal, such that $D_x=D_y$.

(A14) In embodiments of image sensor (A13), the average spacing between any two closest phase-shift layers is $n\sqrt{2}P_x$, where n is a positive integer.

(A15) In the embodiments of image sensor (A14), a total number of phase-shift layers is equal to one half of the number of microlenses, such that $N_L=\frac{1}{2}N_{ML}$.

(A16) In embodiments of image sensor (A13), the average spacing between any two closest phase-shift layers being $mP_x$, where m is an integer greater than one.

(A17) In embodiments of image sensor (A16), the total number of phase-shift layers is equal to one quarter of the number of microlenses, such that $N_L=\frac{1}{4}N_{ML}$.

(A18) In embodiments of image sensor (A13), a distance between any two closest microlenses without accompanying phase-shift layers being $mP_x$, where m is an integer greater than one.

(A19) In embodiments of image sensor (A18), the total number of phase-shift layers is equal to three quarters of the number of microlenses, such that $N_L=\frac{3}{4}N_{ML}$.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A flare-reducing image sensor, comprising:
   a plurality of pixels, $N_P$ in number, in a semiconductor substrate and forming a pixel array having a pixel pitch $P_x$ and $P_y$ in respective orthogonal directions x and y each parallel to a top surface of the semiconductor substrate;
   a plurality of microlenses, $N_{ML}$ in number, each aligned with a respective one of plurality of pixels and forming a microlens array, $N_{ML}$ being equal to $N_P$; and
   a plurality of phase-shift layers, $N_L$ in number, each aligned with a respective microlens of the microlens array, $N_L$ being less than $N_P$, an average spacing between each phase-shift layer being $D_x$ and $D_y$, in directions x and y respectively, at least one of (i) $D_x$ exceeds $P_x$ and (ii) $D_y$ exceeds $P_y$.

2. The flare-reducing image sensor of claim 1, the average spacing, $D_x$ and $D_y$, being greater in both directions x and y than the pixel pitch, such that $D_x$ exceeds $P_x$, and $D_y$ exceeds $P_y$.

3. The flare-reducing image sensor of claim 1, the average spacing between any two closest phase-shift layers being $n\sqrt{P_x^2+P_y^2}$, where n is a positive integer.

4. The flare-reducing image sensor of claim 1, a distance between any two closest microlenses without accompanying phase-shift layers being $n\sqrt{P_x^2+P_y^2}$, where n is a positive integer.

5. The flare-reducing image sensor of claim 4, the phase-shift layer being diagonally adjacent with the average spacing being $\sqrt{P_x^2+P_y^2}$.

6. The flare-reducing image sensor of claim 1, alternating rows of microlenses in either direction x or y being accompanied with phase-shift layers.

7. The flare-reducing image sensor of claim 1, the pixel pitch in orthogonal directions x and y being equal, such that $P_x = P_y$.

8. The flare-reducing image sensor of claim 7, the average spacing between each phase-shift layer in orthogonal directions x and y being equal, such that $D_x = D_y$.

9. The flare-reducing image sensor of claim 8, the average spacing between any two closest phase-shift layers being $n\sqrt{2}P_x$, where n is a positive integer.

10. The flare-reducing image sensor of claim 9, a total number of phase-shift layers being equal to one half of the number of microlenses, such that $N_L = \frac{1}{2}N_{ML}$.

11. The flare-reducing image sensor of claim 8, the average spacing between any two closest phase-shift layers being $mP_x$, where m is an integer greater than one.

12. The flare-reducing image sensor of claim 11, the total number of phase-shift layers being equal to one quarter of the number of microlenses, such that $N_L = \frac{1}{4}N_{ML}$.

13. The flare-reducing image sensor of claim 8, a distance between any two closest microlenses without accompanying phase-shift layers being $mP_x$, where m is an integer greater than one.

14. The flare-reducing image sensor of claim 13, the total number of phase-shift layers being equal to three quarters of the number of microlenses, such that $N_L = \frac{3}{4}N_{ML}$.

15. The flare-reducing image sensor of claim 1, each microlens having an upper surface and, between the upper surface and the semiconductor substrate, a lower surface, for each phase-shift layer of the plurality of phase-shift layers and the respective microlens of the plurality of microlenses aligned thereto, the phase-shift layer being on the upper surface of the microlens.

16. The flare-reducing image sensor of claim 1, each of the plurality of phase-shift layers being formed of an oxide.

17. A flare-reducing image sensor comprising:
a plurality of pixels, $N_P$ in number, in a semiconductor substrate and forming a pixel array;
a plurality of microlenses, $N_{ML}$ in number, each aligned with a respective one of plurality of pixels and forming a microlens array, $N_{ML}$ being equal to $N_P$; and
a plurality of phase-shift layers, $N_L$ in number, each (i) aligned with a respective microlens of the microlens array, $N_L$ being less than $N_P$ and (ii) having an optical thickness equal to a quarter-wave at a wavelength between 620 nm and 750 nm.

18. The flare-reducing image sensor of claim 17, the wavelength being 630 nm.

\* \* \* \* \*